(12) United States Patent
Yegnashankaran

(10) Patent No.: US 7,705,421 B1
(45) Date of Patent: Apr. 27, 2010

(54) SEMICONDUCTOR DIE WITH AN INTEGRATED INDUCTOR

(75) Inventor: Visvamohan Yegnashankaran, Cupertino, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 484 days.

(21) Appl. No.: 11/283,296

(22) Filed: Nov. 18, 2005

(51) Int. Cl.
*H01L 27/02* (2006.01)

(52) U.S. Cl. .............................. 257/531; 257/E21.022

(58) Field of Classification Search ................. 257/531, 257/E21.022
See application file for complete search history.

(56) References Cited

U.S. PATENT DOCUMENTS

| | | | | |
|---|---|---|---|---|
| 5,446,311 A | * | 8/1995 | Ewen et al. ................ | 257/531 |
| 5,610,433 A | | 3/1997 | Merrill et al. ............... | 257/531 |
| 6,031,445 A | * | 2/2000 | Marty et al. ................ | 336/200 |
| 6,037,649 A | * | 3/2000 | Liou ........................... | 257/531 |
| 6,242,791 B1 | | 6/2001 | Jou ............................. | 257/531 |
| 6,320,491 B1 | | 11/2001 | Gevorgian et al. .......... | 336/200 |
| 6,452,247 B1 | * | 9/2002 | Gardner ...................... | 257/528 |
| 6,703,710 B1 | | 3/2004 | Hopper et al. .............. | 257/758 |
| 6,833,781 B1 | * | 12/2004 | Padmanabhan et al. ..... | 336/200 |
| 6,864,581 B1 | | 3/2005 | Hopper et al. .............. | 257/758 |
| 7,327,010 B2 | * | 2/2008 | Gardner ...................... | 257/528 |
| 7,400,025 B2 | * | 7/2008 | Pitts et al. ................... | 257/531 |
| 2003/0122648 A1 | * | 7/2003 | Ou et al. ..................... | 336/200 |

FOREIGN PATENT DOCUMENTS

EP 725407 A1 * 8/1996

OTHER PUBLICATIONS

U.S. Appl. No. 11/041,658, filed Jan. 24, 2005, Hopper et al.
U.S. Appl. No. 11/200,384, filed Aug. 9, 2005, Johnson et al.
U.S. Appl. No. 11/213,155, filed Aug. 25, 2005, Hopper et al.

* cited by examiner

*Primary Examiner*—Lynne A Gurley
*Assistant Examiner*—Andrew O Arena
(74) *Attorney, Agent, or Firm*—Mark C. Pickering

(57) ABSTRACT

An integrated circuit inductor has a number of vertical metal segments, a number of lower metal straps that electrically connect alternate metal segments, and a number of upper metal straps that electrically connect alternate metal segments to form a continuous electrical path. Layers of a ferromagnetic material are formed normal to the metal segments to extend past at least two sides of each metal segment to increase the inductance of the inductor.

20 Claims, 6 Drawing Sheets

US 7,705,421 B1

SEMICONDUCTOR DIE WITH AN INTEGRATED INDUCTOR

BACKGROUND OF THE INVENTION

1. Field of the Invention

The present invention relates to inductors and, more particularly, to a semiconductor die with an integrated inductor.

2. Description of the Related Art

Inductors are common circuit elements that are used in numerous devices. In many applications, inductors are implemented as stand-alone devices which, in turn, consume a significant amount of circuit board space. In order to minimize the required circuit board space for hand-held devices, it is desirable to integrate an inductor into a chip.

FIGS. 1A-1D shows views that illustrate a prior art integrated circuit inductor 100. FIG. 1A shows a plan view, while FIG. 1B shows a cross-sectional view taken along lines 1B-1B of FIG. 1A. In addition, FIG. 1C shows a cross-sectional view taken along lines 1C-1C of FIG. 1A, while FIG. 1D shows a cross-sectional view taken along lines 1D-1D of FIG. 1A.

As shown in FIGS. 1A-1D, inductor 100 is formed on top of a four metal layer interconnect structure that includes a fourth layer of insulation material I4, and a metal trace 110 that is formed on insulation layer I4 from a fourth metal layer M4. In addition, the metal interconnect structure includes a fifth layer of insulation material I5 that is formed on metal trace 110, and a via 112 that is formed through insulation layer I5 to make an electrical connection with metal trace 110.

As further shown in FIGS. 1A-1D, inductor 100 includes a metal trace 114 that is formed on top of the fifth layer of insulation material I5 from a fifth metal layer M5. Metal trace 114, which has a width W and a depth D, has a first end 120 that is formed over via 112 to make an electrical connection with via 112, and a second end 122. Metal trace 114, which makes one and a half loops in the same plane, is typically formed on top of the metal interconnect structure to avoid inducing currents in the substrate.

One important measure of an inductor is the quality factor or Q of an inductor. High Q inductors are desirable in a number of RF circuits, such as resonant circuits. The Q of an inductor is a measure of the ratio of magnetic energy stored in the inductor versus the total energy fed into the inductor, and is given by equation (EQ.) 1 as:

$$Q=\omega L/Z,\qquad \text{EQ. 1}$$

where ω is related to the frequency f of the signal applied to the inductor (ω=2(pi)(f)), L represents the inductance of the inductor, and Z represents the RF impedance of the inductor. Thus, as indicated by EQ. 1, the higher the inductance, the higher the Q of the inductor.

One approach to increasing the inductance of an inductor is to form the coil structure around a ferromagnetic core structure. Due to the difficulty in forming planar inductors, such as inductor 100, around a ferromagnetic core structure, many current-generation integrated circuit inductors are formed as micro-electromechanical system (MEMS) devices.

FIG. 2 shows a perspective view that illustrates an example of a prior-art MEMS inductor 200. As shown in FIG. 2, MEMS inductor 200 includes a base conductive plate 210, and a top conductive plate 212 that lies over base conductive plate 210. MEMS inductor 200 also includes a conductive sidewall 214 that has a bottom surface that contacts base conductive plate 210, and a top surface that contacts top conductive plate 212. In addition, MEMS inductor 200 further includes a conductive sidewall 216 that has a top surface that contacts top conductive plate 212.

As shown, base conductive plate 210, top conductive plate 212, and conductive sidewalls 214 and 216, which can be formed from materials including copper, define an enclosed region 220 that lies only between the base and top conductive plates 210 and 212, and sidewalls 214 and 216.

As further shown, MEMS inductor 200 includes a magnetic core structure 222 that is located within enclosed region 220, and within no other enclosed regions. Magnetic core structure 222, which is electrically isolated from all other conductive regions, can be implemented in a number of prior-art fashions. For example, magnetic core structure 222 can be implemented with a number of laminated Ni—Fe cores 224 which are thin enough to minimize eddy currents.

In operation, a current I1 can flow into MEMS inductor 200 along the bottom side of sidewall 216, and out along the near end of bottom conductive plate 210 that lies away from sidewall 214. A current I2 can also flow in the opposite direction, flowing into MEMS inductor 200 along the end of bottom conductive plate 210 that lies away from sidewall 214, and flowing out along the bottom side of sidewall 216.

Although there are various solutions for forming integrated circuit inductors around ferromagnetic core structures, there is a continuing need for integrated circuit inductors which are simple to form and which provide a larger inductance that can be obtained with conventional planar inductors.

BRIEF DESCRIPTION OF THE DRAWINGS

FIG. 1A is a plan view. FIG. 1B is a cross-sectional view taken along lines 1B-1B of FIG. 1A. FIG. 1C is a cross-sectional view taken along lines 1C-1C of FIG. 1A. FIG. 1D is a cross-sectional view taken along lines 1D-1D of FIG. 1A.

FIG. 3A is a top view of die 300, while FIG. 3B is a cross-sectional view taken along lines 3B-3B of FIG. 3A. FIG. 3C is a plan view illustrating the layer of metal-2 regions 332, isolation layer 340, and ferromagnetic trace 394 of metal interconnect structure 324 of die 300.

DETAILED DESCRIPTION OF THE INVENTION

Figure 1A:
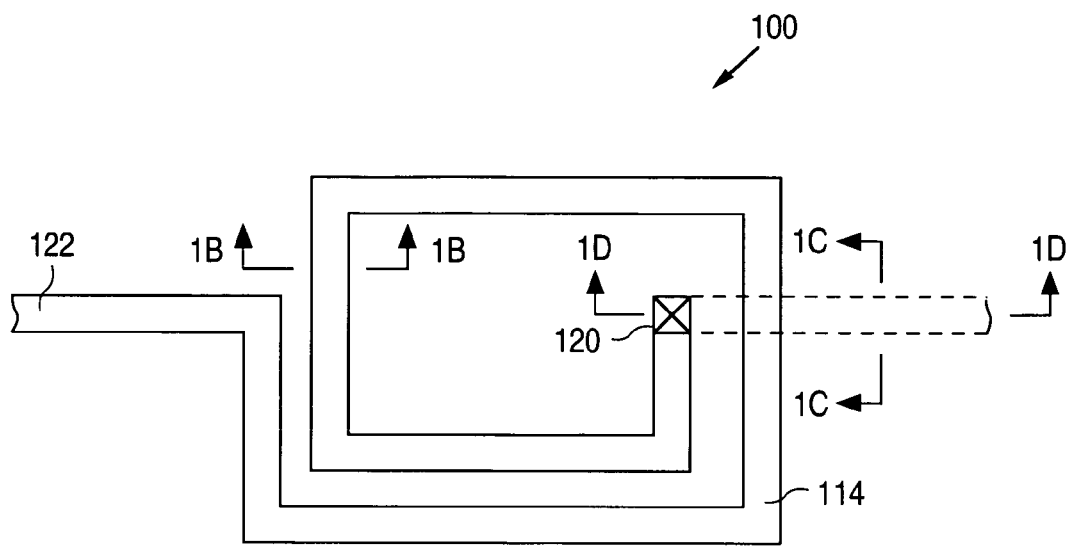
FIGS. 1A-1D are views that illustrate a prior art integrated circuit inductor 100.
Figure 1B:
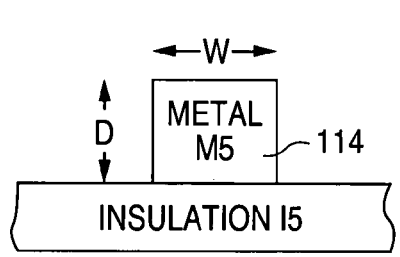
Figure 1C:
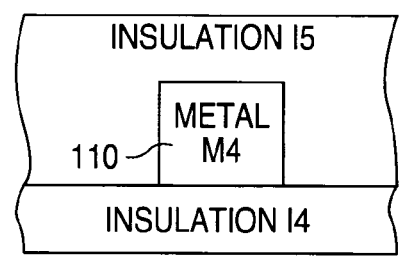
Figure 1D:
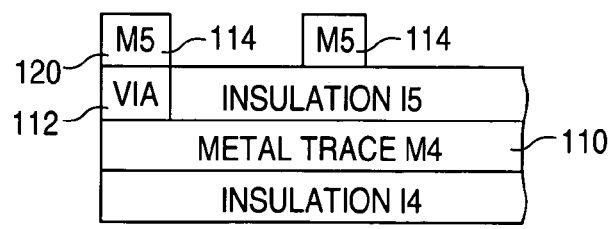
Figure 2:
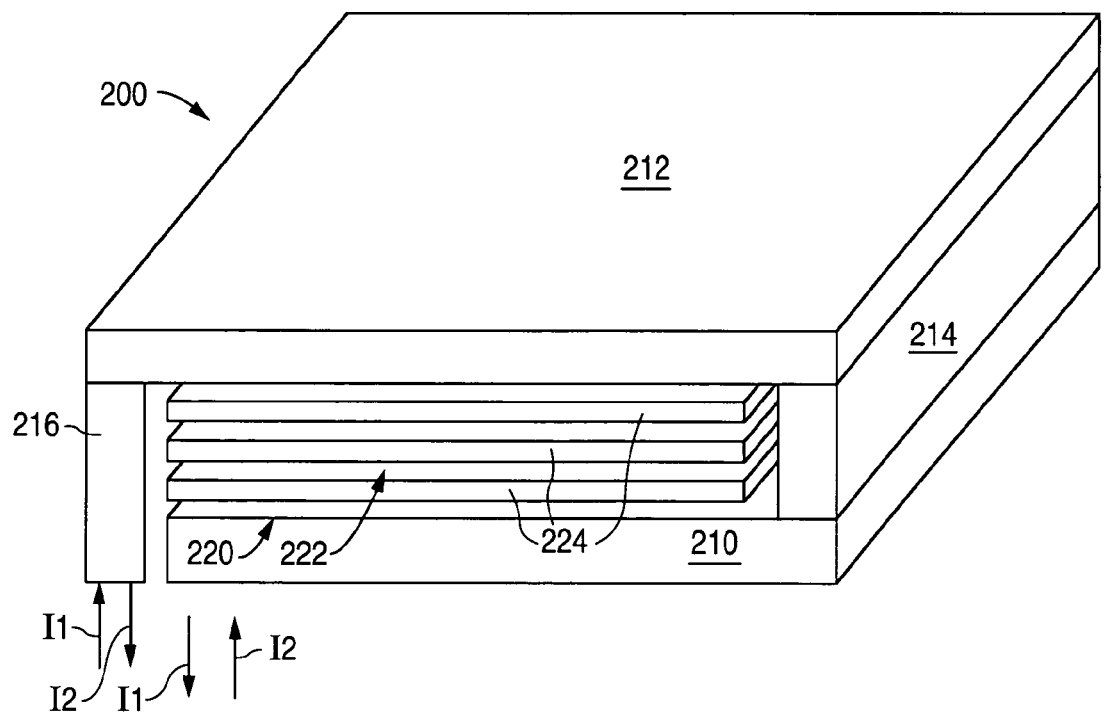
FIG. 2 is a perspective view illustrating an example of a prior-art MEMS inductor 200.
Figure 3A:
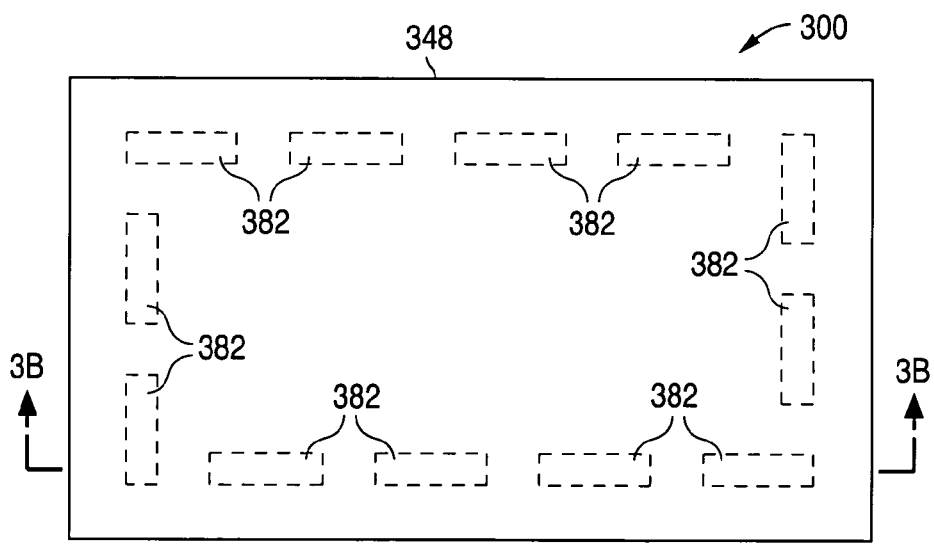
FIGS. 3A-3C are views illustrating an example of a semiconductor die 300 in accordance with the present invention.
Figure 3B:
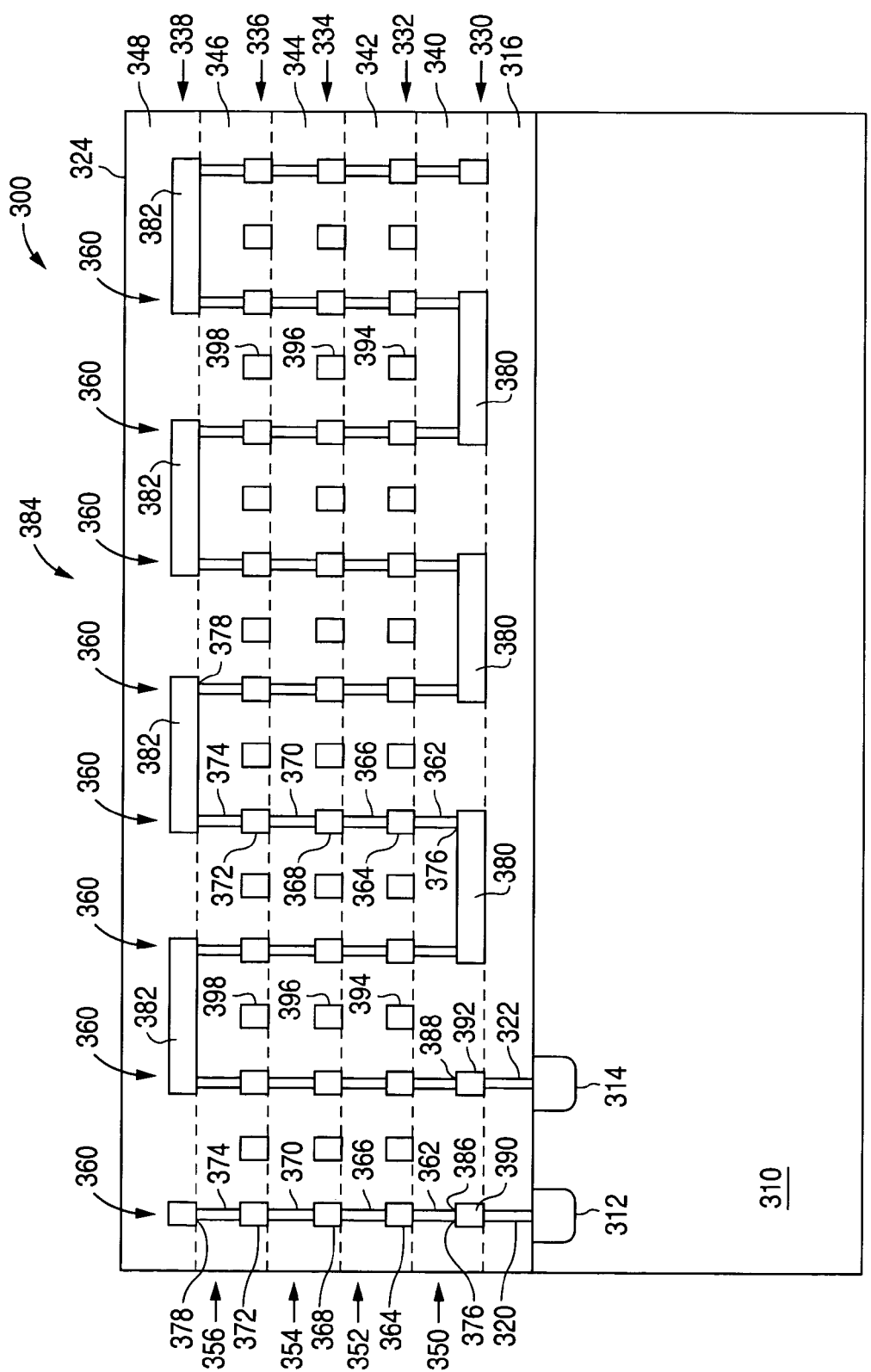
Figure 3C:
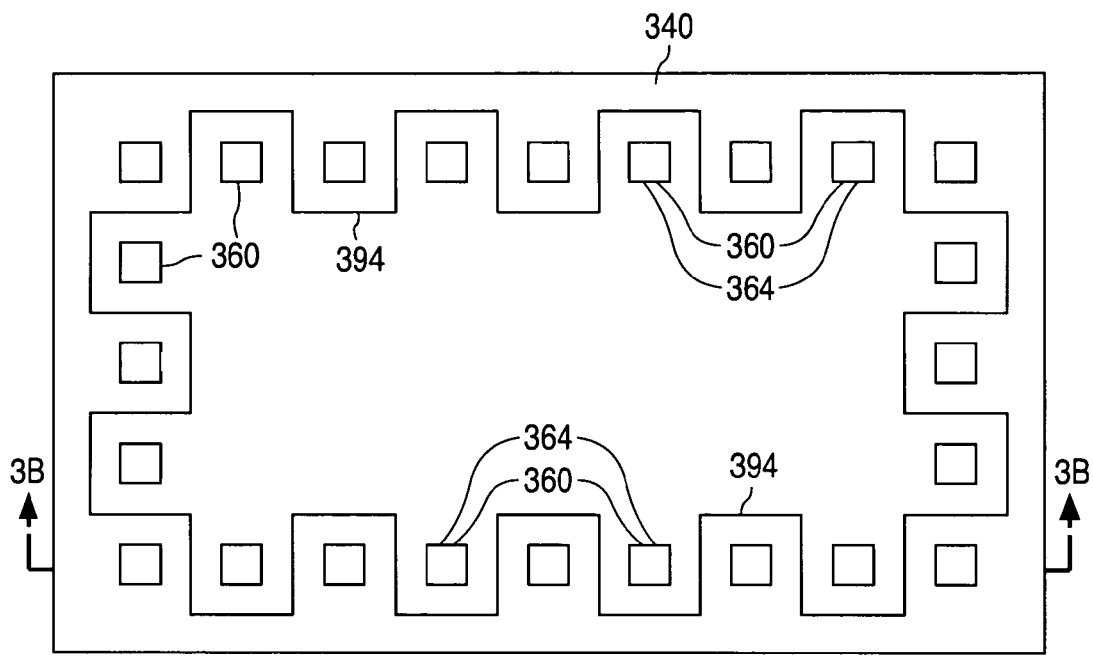

FIGS. 3A-3C show views that illustrate an example of a semiconductor die 300 in accordance with the present invention. FIG. 3A shows a top view of die 300, while FIG. 3B shows a cross-sectional view taken along lines 3B-3B of FIG. 3A. FIG. 3C shows a plan view that illustrates the layer of metal-2 regions 332, isolation layer 340, and ferromagnetic trace 394 of metal interconnect structure 324 of die 300.

As shown in FIGS. 3A-3C, semiconductor die 300 includes a substrate 310, and doped regions 312 and 314 that are formed in substrate 310. Doped regions 312 and 314, which are part of a semiconductor circuit that has a large number of transistors formed in and on substrate 310, can have the same or an opposite conductivity type as substrate 310. When substrate 310 and doped regions 312 and 314 share the same conductivity type, doped regions 312 and 314 have a greater dopant concentration than substrate 310.

Die 300 additionally includes an insulation layer 316 that is formed on substrate 310, and contacts 320 and 322 that are formed through insulation layer 316 to make an electrical connection with doped regions 312 and 314. Insulation layer 316 can be implemented with, for example, a layer of oxide. In addition to contacts 320 and 322, die 300 also includes a large number of additional contacts that make electrical connections to the transistors and other devices that form the semiconductor circuit.

Further, die 300 includes a metal interconnect structure 324 that contacts insulation layer 316 and contacts 320 and 322. Metal interconnect structure 324 also contacts the other contacts to provide an electrical interconnection between the transistors and other devices that form the semiconductor circuit.

In the FIGS. 3A-3C example, metal interconnect structure 324 is implemented as a five metal layer device that includes a layer of patterned metal-1 regions 330, a layer of patterned metal-2 regions 332, a layer of patterned metal-3 regions 334, a layer of patterned metal-4 regions 336, and a layer of patterned metal-5 regions 338.

In addition, metal interconnect structure 324 in the FIGS. 3A-3C example includes five layers of isolation material that includes a first isolation layer 340, a second isolation layer 342, a third isolation layer 344, a fourth isolation layer 346, and a fifth isolation layer 348. As shown, the metal-1 regions 330 contact insulation layer 316, while first isolation layer 340 contacts the metal-1 regions 330 and the insulation layer 316.

Similarly, the metal-2 regions 332 contact first isolation layer 340, while second isolation layer 342 contacts the metal-2 regions 332 and the first isolation layer 340. The metal-3 regions 334 contact second isolation layer 342, while third isolation layer 344 contacts the metal-3 regions 334 and the second isolation layer 342. The metal-4 regions 336 contact third isolation layer 344, while fourth isolation layer 346 contacts the metal-4 regions 336 and the third isolation layer 344. The metal-5 regions 338 contact fourth isolation layer 346, while fifth isolation layer 348 contacts the metal-5 regions 338 and the fourth isolation layer 346.

Metal interconnect structure 324 in the FIGS. 3A-3C example further includes four layers of vias that include a layer of first vias 350, a layer of second vias 352, a layer of third vias 354, and a layer of fourth vias 356. The vias in the layer of first vias 350 are formed through the first isolation layer 340 to make electrical connections with the metal-1 and metal-2 regions 330 and 332.

Similarly, the vias in the layer of second vias 352 are formed through the second isolation layer 342 to make electrical connections with the metal-2 and metal-3 regions 332 and 334. The vias in the layer of third vias 354 are formed through the third isolation layer 344 to make electrical connections with the metal-3 and metal-4 regions 334 and 336. The vias in the layer of fourth vias 356 are formed through the fourth isolation layer 346 to make electrical connections with the metal-4 and metal-5 regions 336 and 338.

In accordance with the present invention, metal interconnect structure 324 includes a number of metal segments 360 that each include a via 362 from the layer of first vias 350, a metal region 364 from the layer of metal-2 regions 332, a via 366 from the layer of second vias 352, a metal region 368 from the layer of metal-3 regions 334, a via 370 from the layer of third vias 354, a metal region 372 from the layer of metal-4 regions 336, and a via 374 from the layer of fourth vias 356.

In addition, each metal segment 360 has a lower end 376 and an upper end 378, and is substantially vertical with respect to the surface of substrate 310.

Further, metal interconnect structure 324 includes a number of first metal straps 380 that are connected to the metal segments 360. Each first metal strap 380, which is a region of the metal-1 regions 330, electrically connects together the lower end 376 of a metal segment 360 and the lower end 376 of an adjacent metal segment 360.

In addition, metal interconnect structure 324 includes a number of second metal straps 382 that are connected to the metal segments 360. Each second metal strap 382, which is a region of the metal-5 regions 338, electrically connects together the upper end 378 of a metal segment 360 and the upper end 378 of an adjacent metal segment 360 to form an inductor 384. Inductor 384 has a continuous electrical path that extends from a first end 386 to a second end 388 through each metal segment 360, each first metal strap 380, and each second metal strap 382.

Further, the first end 386 is electrically connected to doped region 312 via contact 320 and a metal region 390, while the second end 388 is electrically connected to doped region 314 via contact 322 and a metal region 392. Metal regions 390 and 392 are regions of the metal-1 regions 330.

In addition, metal interconnect structure 324 in the FIGS. 3A-3C example includes three layers of ferromagnetic traces that include a first ferromagnetic trace 394 that lies between the first and second isolation layers 340 and 342, a second ferromagnetic trace 396 that lies between the second and third isolation layers 342 and 344, and a third ferromagnetic trace 398 that lies between the third and fourth isolation layers 344 and 346.

FIG. 3C shows a plan view that illustrates the layer of metal-2 regions 332, isolation layer 340, and ferromagnetic trace 394 of metal interconnect structure 324 of die 300. FIG. 3C can alternately represent the layer of metal-3 regions 334, isolation layer 342, and ferromagnetic trace 396, or the layer of metal-4 traces 336, isolation layer 344, and ferromagnetic trace 398.

As shown in FIG. 3C, ferromagnetic trace 394 extends between each pair of adjacent metal segments 360. In the FIG. 3C example, ferromagnetic trace 394 forms a continuous loop. Ferromagnetic trace 394 extends past three sides of each metal segment 360 except for the corner segments 360, and extends past two sides of each corner segment 360.

Although the ferromagnetic traces 394, 396, and 398 are illustrated in the present example as being vertically isolated, two ferromagnetic traces can alternately be connected together. For example, if an inductor of the present invention extends across die 300 from one side to the other, a continuous ferromagnetic loop can be formed by extending across die 300 in one layer, and extending back across die 300 in a second layer.

Figure 4:
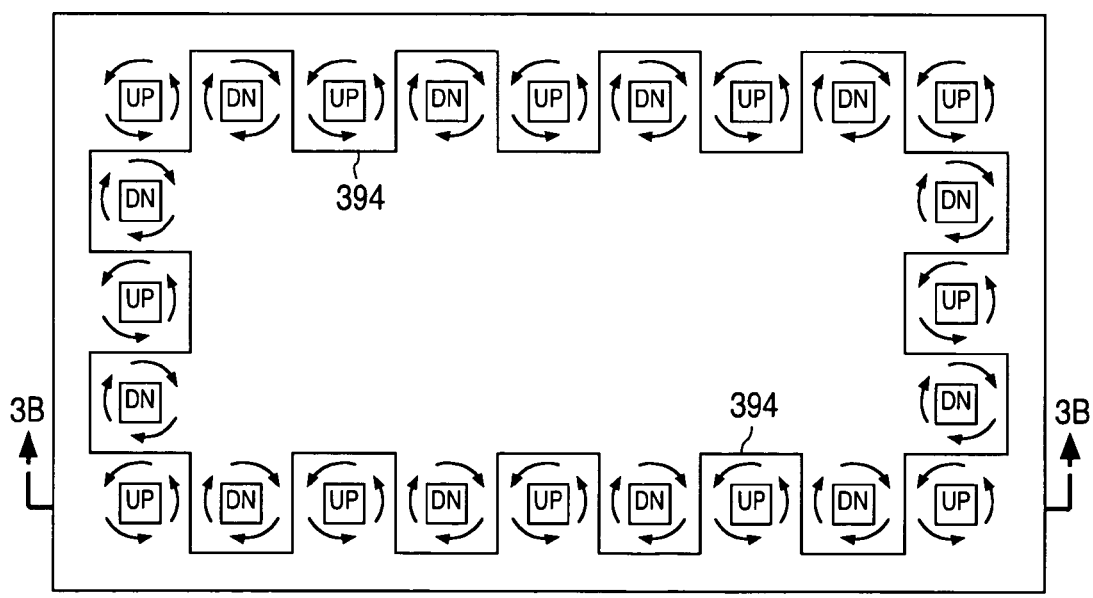
FIG. 4 is FIG. 3C, illustrating the operation of inductor 384 in accordance with the present invention.

FIG. 4 shows FIG. 3C, and illustrates the operation of inductor 384 in accordance with the present invention. In operation, a current can flow into first end 386 of inductor 384, through each metal segment 360, each first metal strap 380, each second metal strap 382, and out of second end 388.

Alternately, a current can flow into second end 388 of inductor 384, through each metal segment 360, each first metal strap 380, each second metal strap 382, and out of first end 386. When an alternating current (AC) is provided, a current flows into first end 386 during a first half cycle, and out of first end 386 during a second half cycle.

In the FIG. 4 example, a current flows into first end 386 and out of second end 388. As shown in FIG. 4, the current has a first component UP that flows up a number of metal segments 360, as well as a down component DN that flows down a number of metal segment 360.

A current flowing through each of the metal segments 360 of inductor 384 generates circular magnetic flux lines (represented by the circular arrows in FIG. 4) which have an orientation that depends on whether the current is flowing up a metal segment 360 or down a metal segment 360.

As shown in FIG. 4, the magnetic flux lines generated from each metal segment reinforce each other, and form a magnetic flux that flows through ferromagnetic trace 394. Like ferromagnetic trace 394, magnetic flux also flows through ferromagnetic traces 396 and 398 which, in turn, significantly increases the inductance of inductor 384.

Thus, an integrated circuit inductor and a ferromagnetic core structure has been described that significantly increases the inductance provided by an inductor. Although the present invention has been described with a five metal layer metal interconnect structure, fewer than five metal layers and more than five metal layers can alternately be used.

In addition, the second metal straps 382 can be implemented with the top metal layer as presently illustrated where no metal region of die 300 lies directly vertically over a second metal strap 382 (wire bonding lines are not part of die 300), or the second metal straps can be implemented with a lower metal layer. Further, the lower ferromagnetic trace need not be formed in the second layer, but can be formed in a higher layer.

Figure 5A:
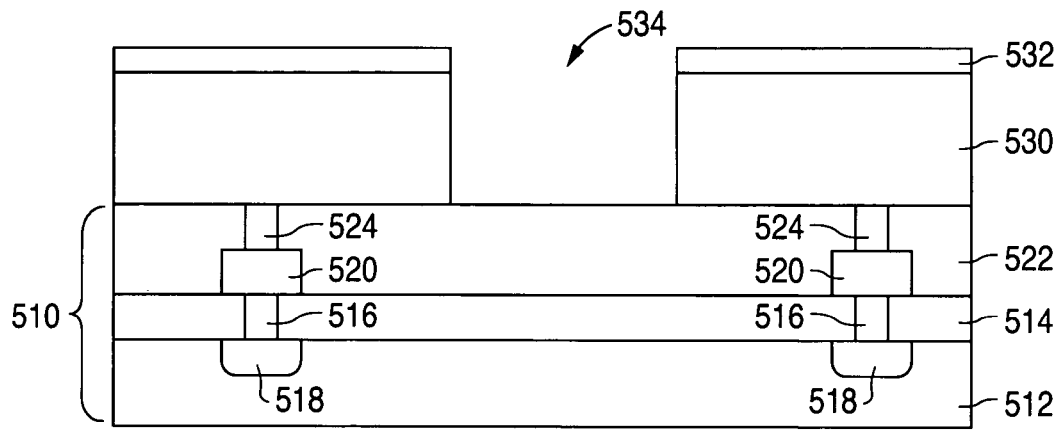
FIGS. 5A-5E are cross-section diagrams illustrating a method of forming an inductor 500 in accordance with the present invention.

FIGS. 5A-5E show cross-section diagrams that illustrate a method of forming an inductor 500 in accordance with the present invention. As shown in FIG. 5A, the method begins with a conventionally formed structure 510 that includes a substrate 512, an overlying insulation layer 514, and a number of contacts 516 which have been formed through insulation layer 514 to make electrical connections with a number of doped regions 518 formed in substrate 512.

In addition, structure 510 includes a number of metal regions 520 from a first layer of metal-1 regions that are formed on insulation layer 514 to make an electrical connection with the contacts 516, an isolation layer 522 that is formed on insulation layer 514 and the metal regions 520, and a number of vias 524 that are formed through isolation layer 522 to make an electrical connection with the metal regions 520.

As further shown in FIG. 5A, method 500 begins by forming an isolation layer 530, such as oxide, on isolation layer 522, followed by the formation and patterning of a mask 532. Following this, isolation layer 530 is etched to form a trench 534 that extends around the periphery of the die. Mask 532 is then removed.

Figure 5B:
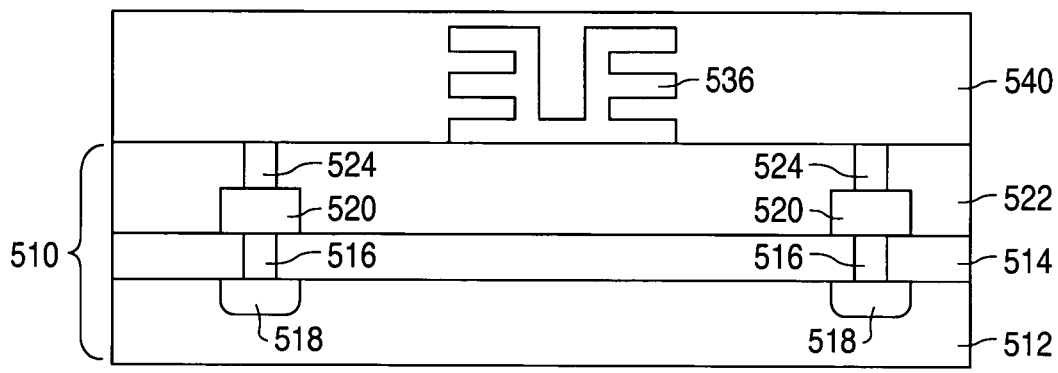

Next, as shown in FIG. 5B, a ferromagnetic trace 536, such as trace 394, is formed in trench 534 using any of a number of well-known prior-art methods. For example, Park et al., "Ultralow-Profile Micromachined Power Inductors with Highly Laminated Ni/Fe Cores: Application to Low-Megahertz DC-DC Converters," IEEE Transactions of Magnetics, Vol. 39, No. 5, September 2003, pp 3184-3186, which is hereby incorporated by reference, teach the formation of a MEMS magnetic core structure that uses laminated Ni—Fe structures. The laminated Ni—Fe structures are very thin to limit the formation of eddy currents.

As taught by Park et al., to form a magnetic core structure, a mold (trench 534 in this case) is filled with a sequential electrodeposition of Ni—Fe (80%-20%) and Cu layers. After a number of layers have been formed, the mold (isolation layer 530 in this case) is removed, and a new layer of photoresist is patterned. A central trench is formed, and a final Ni—Fe layer is then electroplated. The photoresist is then removed, and the Cu is then etched away from between the Ni—Fe layers to form ferromagnetic trace 536. Following this, an isolation layer 540, such is oxide, is deposited on isolation layer 522 which, in turn, isolates the adjacent Ni—Fe layers of ferromagnetic trace 536.

Figure 5C:
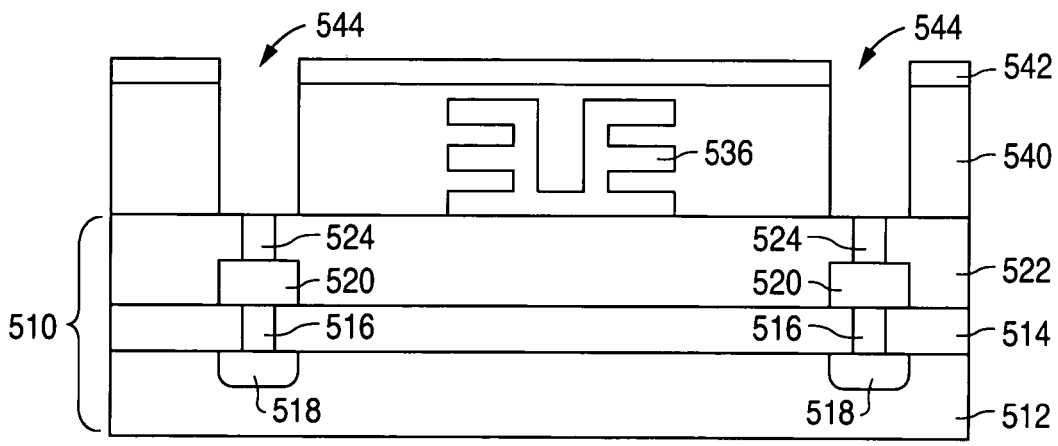

Following this, as shown in FIG. 5C, a mask 542 is formed on isolation layer 540, and etched to form an opening 544 for each metal region 520 (e.g., 364). As shown, each opening 544 exposes a via 524. Mask 542 is then removed.

Figure 5D:
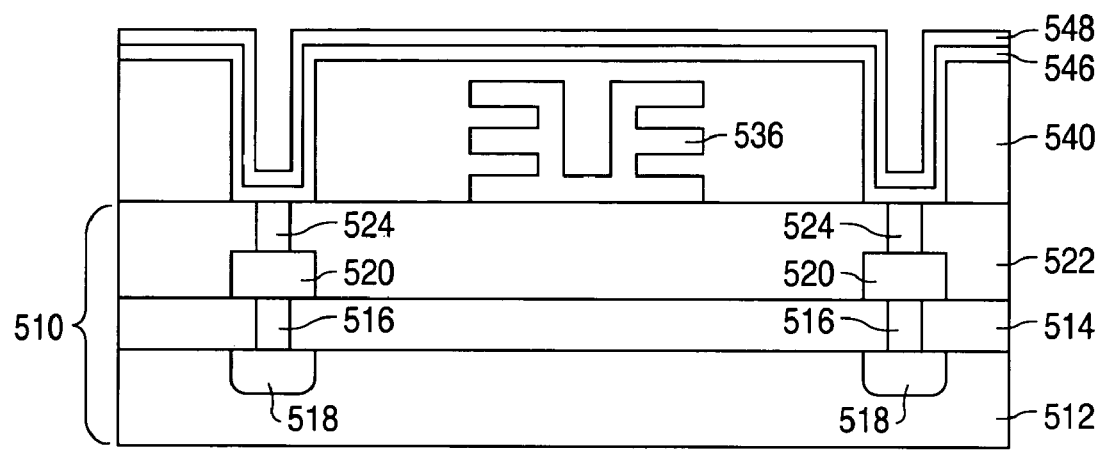
Figure 5E:
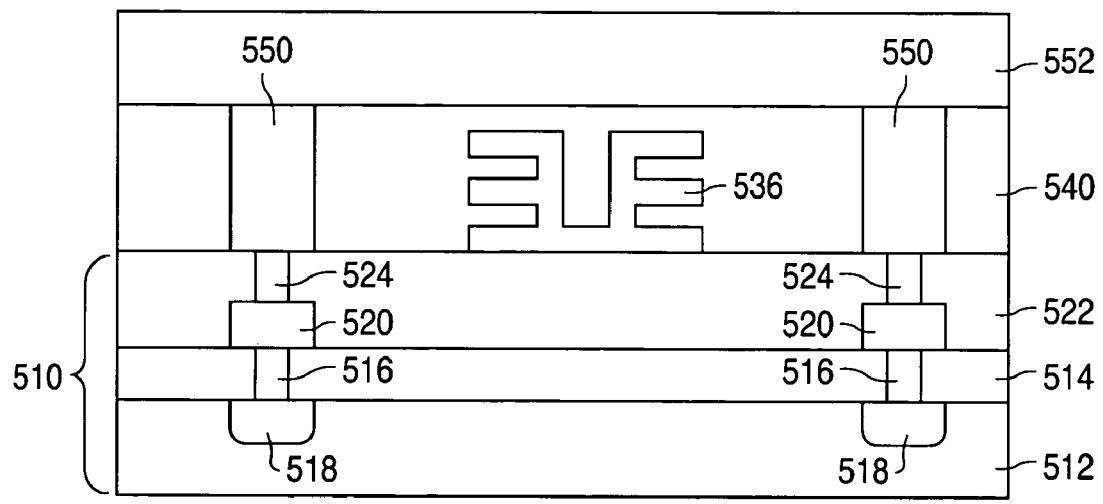

Next, as shown in FIG. 5D, a barrier layer 546 is formed on isolation layer 540, followed by the formation of a copper seed layer 548 and electroplating. The resulting layer is then planarized until removed from the top surface of isolation layer 540, thereby forming a copper metal region 550, such as a metal region 364, as shown in FIG. 5E. Barrier layer 546 prevents copper seed layer 548, such as chromium, copper, chromium (Cr—Cu—Cr), from diffusing into isolation layer 540 and can be implemented with, for example, tantalum Ta or tantalum nitride TaN. The planarization can be performed using, for example, conventional chemical mechanical polishing.

Following this, an isolation layer 552 is formed on metal region 550 and over ferromagnetic trace 536, followed by the conventional formation of a layer of vias that extend through isolation layer 552 to make an electrical connection with metal region 550. The above steps are then repeated until the ferromagnetic traces and the corresponding metal regions of the metal segments have been formed, followed by the conventional formation of the top metal layer (which includes the top metal straps 382).

It should be understood that the above descriptions are examples of the present invention, and that various alternatives of the invention described herein may be employed in practicing the invention. For example, although inductor 384 has been illustrated with a continuous electrical path that extends around the periphery of the die, the continuous electrical path of inductor 384 can extend along any number of sides, including only one side, of die 300, or any section of die 300 (as any length of wire has an inductance).

In addition, an inductor in accordance with the present invention can be formed on both sides of die 300 and used separately, or connected together via, for example, a conventionally formed electrical path that extends through the die. Thus, it is intended that the following claims define the scope of the invention and that structures and methods within the scope of these claims and their equivalents be covered thereby.

What is claimed is:

1. A semiconductor die comprising:
a substrate having a top surface; and
a metal interconnect structure that contacts the top surface of the substrate, the metal interconnect structure having:
a dielectric material;
a number of metal segments that touch the dielectric material, each metal segment having a lower end and an upper end, the number of metal segments being spaced apart and including a first metal segment, a second metal segment, and a third metal segment, the first, second, and third metal segments each having a first side region, a second side region opposite the first side region, a third side region, and a fourth side region opposite the third side region;

a number of lower metal straps, each lower metal strap electrically connecting together the lower end of a metal segment and the lower end of an adjacent metal segment, a lower metal strap directly touching the lower end of the first metal segment and the lower end of the second metal segment;

a number of upper metal straps, each upper metal strap electrically connecting together the upper end of a metal segment and the upper end of an adjacent metal segment, an upper metal strap directly touching the upper end of the second metal segment and the upper end of the third metal segment, a continuous electrical path extending from a first end to a second end through each metal segment, each lower metal strap, and each upper metal strap; and a trace that touches the dielectric material and lies substantially only parallel to the top surface of the substrate, the trace including a magnetic material, having a plurality of turns that wind between the number of metal segments, and enclosing three of the four side regions of each of the first, second, and third metal segments.

2. The semiconductor die of claim 1 wherein:
each lower metal strap contacts only two metal segments; and
each upper metal strap contacts only two metal segments.

3. The semiconductor die of claim 1 wherein one of the three side regions of the first metal segment enclosed by the trace and one of the three side regions of the second metal segment enclosed by the trace are different.

4. The semiconductor die of claim 1 wherein the trace is a ferromagnetic material.

5. The semiconductor die of claim 1 wherein each metal segment includes metal regions and vias, each via directly touching a vertically adjacent pair of metal regions.

6. The semiconductor die of claim 1 wherein the trace forms a continuous loop.

7. The semiconductor die of claim 1 wherein the continuous electrical path extends around a periphery of the die.

8. A semiconductor die comprising:
a substrate having a top surface; and
a metal interconnect structure that contacts the top surface of the substrate, the metal interconnect structure having:
a dielectric material;
a number of metal segments that touch the dielectric material, each metal segment having a lower end and an upper end, the number of metal segments being spaced apart and including a first metal segment, a second metal segment, and a third metal segment, the first, second, and third metal segments each having a first side region, a second side region opposite the first side region, a third side region, and a fourth side region opposite the third side region;
a number of lower metal straps, each lower metal strap electrically connecting together the lower end of a metal segment and the lower end of an adjacent metal segment, a lower metal strap directly touching the lower end of the first metal segment and the lower end of the second metal segment;
a number of upper metal straps, each upper metal strap electrically connecting together the upper end of a metal segment and the upper end of an adjacent metal segment, an upper metal strap directly touching the upper end of the second metal segment and the upper end of the third metal segment, a continuous electrical path extending from a first end to a second end through each metal segment, each lower metal strap, and each upper metal strap; and a trace that touches the dielectric material and lies substantially parallel to the top surface of the substrate, the trace including a magnetic material, having a plurality of turns that wind between the number of metal segments, and enclosing only three of the four side regions of each of the first, second, and third metal segments.

9. The semiconductor die of claim 8 wherein the trace forms a continuous loop.

10. The semiconductor die of claim 8 wherein the trace is a ferromagnetic material.

11. The semiconductor die of claim 8 wherein one of the three side regions of the first metal segment enclosed by the trace and one of the three side regions of the second metal segment enclosed by the trace are different.

12. The semiconductor die of claim 8 wherein:
each lower metal strap contacts only two metal segments; and
each upper metal strap contacts only two metal segments.

13. The semiconductor die of claim 8 wherein each metal segment includes metal regions and vias, each via directly touching a vertically adjacent pair of metal regions.

14. The semiconductor die of claim 8 wherein the continuous electrical path extends around a periphery of the die.

15. A semiconductor die comprising:
a substrate having a top surface; and
a metal interconnect structure that contacts the top surface of the substrate, the metal interconnect structure having:
a dielectric material;
a number of metal segments that touch the dielectric material, each metal segment having a lower end and an upper end, the number of metal segments being spaced apart and including a first metal segment, a second metal segment, and a third metal segment, the first, second, and third metal segments each having a first side region, a second side region opposite the first side region, a third side region, and a fourth side region opposite the third side region;
a number of lower metal straps, each lower metal strap electrically connecting together the lower end of a metal segment and the lower end of an adjacent metal segment, a lower metal strap directly touching the lower end of the first metal segment and the lower end of the second metal segment;
a number of upper metal straps, each upper metal strap electrically connecting together the upper end of a metal segment and the upper end of an adjacent metal segment, an upper metal strap directly touching the upper end of the second metal segment and the upper end of the third metal segment,
a continuous electrical path extending from a first end to a second end through each metal segment, each lower metal strap, and each upper metal strap; and
two or more traces that each touch the dielectric material and lie substantially only parallel to the top surface of the substrate, each trace being electrically isolated from each other trace, including a magnetic material, having a plurality of turns that wind between the number of metal segments, and enclosing three of the four side regions of each of the first, second, and third metal segments.

16. The semiconductor die of claim 15 wherein each trace forms a continuous loop.

17. The semiconductor die of claim 15 wherein each trace is a ferromagnetic material.

18. The semiconductor die of claim 15 wherein:
each lower metal strap contacts only two metal segments; and
each upper metal strap contacts only two metal segments.

19. The semiconductor die of claim 15 wherein the continuous electrical path extends around a periphery of the die.

20. The semiconductor die of claim 15 wherein one of the three side regions of the first metal segment enclosed by the trace and one of the three side regions of the second metal segment enclosed by the trace are different.

* * * * *